United States Patent [19]

Khadzhi et al.

[11] 4,024,013
[45] May 17, 1977

[54] METHOD OF PRODUCING CITRINE CRYSTALS

[76] Inventors: Valentin Evstafievich Khadzhi, ulitsa Institutskaya, 14, kv. 8; Galina Vasilievna Reshetova, ulitsa Lenina, 24, kv. 6, both of Alexandrov Vladimirskoi oblasti, U.S.S.R.

[22] Filed: Jan. 11, 1974

[21] Appl. No.: 432,650

[52] U.S. Cl. .............................. 156/623 Q; 23/300; 23/301; 423/339; 423/264; 106/42
[51] Int. Cl.² .................... B01J 17/04; C01B 33/12
[58] Field of Search ......... 23/301 R, 300; 423/335, 423/339, 334, 264; 106/42; 252/62.9; 156/623 Q

[56] References Cited

UNITED STATES PATENTS

| | | | |
|---|---|---|---|
| 2,468,761 | 5/1949 | Kjellgren | 23/301 R |
| 2,484,829 | 10/1949 | Holden | 23/301 R |
| 2,543,071 | 2/1951 | Slawson | 23/301 R |
| 2,871,192 | 1/1959 | Augustine | 23/301 R |
| 2,923,605 | 2/1960 | Jaffe | 23/301 R |
| 3,051,558 | 8/1962 | Jost | 23/301 R |
| 3,291,575 | 12/1966 | Sawyer | 23/301 R |
| 3,356,463 | 12/1967 | Ballman | 23/301 R |
| 3,394,081 | 7/1968 | Ballman | 23/301 R |
| 3,576,608 | 4/1971 | Gehres | 23/301 R |
| 3,832,146 | 8/1974 | Bresnahan | 23/301 R |
| 3,936,276 | 2/1976 | Balitsky | 156/623 Q |

FOREIGN PATENTS OR APPLICATIONS

| | | | |
|---|---|---|---|
| 797,203 | 6/1958 | United Kingdom | 23/301 R |

OTHER PUBLICATIONS

Tzinober et al., "Kristallographija" Journal, 4, 633, 1959.
Brown, Nature, Jan. 5, 1952, No. 4288, vol. 169, pp. 35 to 36.
White, The Synthesis and Uses of Artificial Gemstones, Endeavor, Apr. 1962, pp. 73 thru 84.
Gordienko et al., Collection of Articles, "Crystal Growth," 1967, vol. 7, pp. 338–343, Nauka Publishers.

*Primary Examiner*—Stephen J. Emery

[57] ABSTRACT

A method of producing citrine crystals comprising the step of growing citrine crystals under hydrothermal conditions by the temperature difference method in a high-pressure autoclave on crystalline quartz seeding plates oriented in parallel with the pinacoid crystallographic plane {0001} or with planes inclined at an angle within the range of up to 20° with respect to said pinacoid plane using a charge comprising crystalline quartz and aqueous solutions of potassium carbonate with a concentration of from 5–10 wt.%. Said solutions contain iron introduced in the autoclave in the form of metallic iron in an amount of from 2–20 g per lit. of the solution, as well as nitrites or nitrates of alkali metals or potassium permanganate which are introduced in the autoclave in an amount of from 1–20 g per lit. of the solution. The above-described method of growing citrine crystals is carried out at a crystallization temperature of from 300°–345° C, under a pressure of from 300–1500 kg/cm² and at a rate of from 0.2–1 mm/day. The method according to the invention is characterized by simple production equipment and technological steps, and is reliably reproducable in high-pressure autoclaves having varying capacities. The method yields high-grade citrine crystals having various shades which are intensively colored over the entire volume of the monocrystalline layer grown. Such crystals may be widely used as semiprecious stones in jewelry.

3 Claims, No Drawings

METHOD OF PRODUCING CITRINE CRYSTALS

The invention relates to the methods of producing citrine crystals which represent a species of monocrystalline quartz having a yellow colour of various shades. Such citrine crystals are widely used in jewelry as semiprecious stones.

A method of producing citrine crystals by growing colourless quartz crystals under hydrothermal conditions by the temperature difference method in high-pressure autoclaves on crystalline quartz seeding plates oriented in parallel with the pinacoid crystallographic plane or with planes inclined at an angle within the range of up to 20° with respect to said pinacoid plane using high concentration aqueous solutions of sodium carbonate and a charge comprising crystalline quartz resulting colourless quartz crystals are subjected to ionizing radiation which results in the appearance of the citrine colour (cf. L. A. Gordienko et al., "Collection of Articles" "Crystal Growth", 1967, vol. 7, pp. 338–343, Nauka Publishers).

Natural citrine crystals are very rare, and there is no commercial mining thereof.

The prior art method of producing citrine crystals has a number of disadvantages.

One disadvantage is that the process of growing colourless quartz crystals with the potential citrine colour centers has low reproducability due to the uncertain physical and chemical parameters of this process (crystallization temperature, pressure in the autoclave and the rate of growth of the crystals on the seeding plates having the above-mentioned orientation).

Another is that the color intensity is insufficient for the practical utilization of the citrine crystals which is due to the peculiar structure of the potential centers of citrine colour in the crystals obtained from sodium carbonate solutions.

Also the crystals with the potential centers of citrine colour have only light yellow colour after the ionizing radiation which substantially restricts the variety of jewelry articles made from these crystals.

The nonuniform distribution of the coloured zones over the volume of the crystal, which is due to the continuous thermal destruction of the potential centers of the citrine colour in the crystalline material grown up on the seeding plate so that after the ionizing radiation, only the outer zone of the crystal having a thickness of from 1 to 4 mm will have the citrine colour only for the duration of the growing cycle and the thickness of the layer grown up on the seeding plate. This method excludes the possibility of the practical utilization of citrine crystals obtained by this method.

Also when using high-concentration solutions of sodium carbonate during the growth of the colourless quartz crystals, a precipitate consisting of sodium silicates is deposited which contaminates on the bottom part of the autoclave and substantially hampers the removal of the device containing the charge from the autoclave. Cleaning of the autoclave from sodium silicate precipitate represents rather labour-consuming and unproductive operations.

It is an object of the present invention to provide a method of producing citrine crystals wherein the crystals are grown with predetermined physical and chemical process parameters so as to ensure a satisfactory reproducability of the process.

It is another object of the invention to provide a method which enables citrine crystals to be produced having various shades, with the crystals being intensively coloured throughout the entire volume of the monocrystalline layer grown.

Still another object of the invention is to provide a method which eliminates the formation of a silicate precipitate which hampers the autoclave discharge operation.

With these and other objects in view, the invention consists of growing citrine crystals under hydrothermal conditions by the temperature difference method in a high-pressure autoclave on crystalline quartz seeding plates oriented in parallel with the pinacoid crystallographic plane $\{0001\}$ or with planes inclined at an angle within the range of up to 20° with respect to the said pinacoid plane using a charge comprising crystalline quartz and aqueous solutions of potassium carbonate having a concentration of from 5–10 wt.%; said solutions containing iron introduced in the autoclave in the form of metallic iron in an amount of from 2–20 g per 1 l of the solution, as well as nitrites and nitrates of alkali metals or potassium permanganate introduced into the autoclave in an amount of from 1–20 g per 1 l of the solution; said growing of citrine crystals being carried out at a crystallization temperature of from 300–345° C, under a pressure of from 300°–1500° kg/cm², and at a rate of 0.2–1 mm/day.

The above-described conditions for growing said crystals enable the production of intensively and uniformly coloured citrine crystals having various shades (from the greenish up to orange) which are suitable for utilization in jewelry as semiprecious facetable material. Under the above-described conditions the centers of citrine colour appear directly during the growth of crystals due to the penetration of the impurity ions of trivalent iron into the crystal lattice, said ions being formed in an aqueous solution of potassium carbonate (working solution) during the oxidation of the metallic iron as a result of its reaction with nitrites and nitrates of alkali metals or with potassium permanganate. The above-mentioned centers of the citrine colour are characterized by a relatively high thermal stability which prevents them from being thermally destructed. If the growing process of the crystals is carried out without the addition of the compounds oxidizing the iron into the $Fe^{3+}$ ion, $Fe^{2+}$ ion may then penetrate into the crystals resulting in the production of greenish-brown quartz crystals.

The method of producing citrine crystals according to the invention is characterized by simple production equipment and simple technological steps, which eliminates the use of scarce and expensive starting materials, and which is reliably reproducable in high-pressure autoclaves having varying capacities.

By this method the intensity of the colour and the shades of the crystals may be purposely varied over a wide range in accordance with the customer's wish by controlling the rate of crystal growth. Thus, with an increase in the rate of growth the intensity of the colour is increased, and the citrine crystals acquire an orange shade. With a reduction of the rate of growth, the intensity of the colour decreases, and the citrine crystals acquire a greenish shade.

Among the above-mentioned additives used to oxidize the metallic iron in the working solution into ion $Fe^{3+}$, which is necessary for the formation of the colour centers in the citrine ctystals, nitrites and nitrates of alkali metals are preferably used, and which exhibit a sufficiently high solubility in the working solution of potassium carbonate.

As such nitrates and nitrites of alkali metals are preferably those nitrites and nitrates of lithium. Ions of lithium "purify" the solution of potassium carbonate from undesired aluminium impurities, which are introduced into the solution along with the charge, so that aluminium is converted into hardly soluble silicates, such as eucryptite ($LiAlSiO_4$) which contributes to the uniform growth of the pyramides of the crystal facets. Where there are no lithium ions in the working solutions, the aluminium impurity is accumulated and is then entrained by the growing citrine crystals. This results in the formation of vicinal tubercles, which originate the non-overgrown capillary channels penetrating into the citrine crystals in the direction parallel with the optical axis, thereby substantially disturbing their homogenity.

It is advantageous to introduce into the autoclave, prior to the growing of crystals, 10 g of iron per lit. of the solution, a nitrate or nitrites of alkali metals, or potassium permanganate in an amount of 5 g per lit. of the solution, and to conduct the crystal growing cycle at a crystallization temperature of 335° C, under a pressure of 1500 kg/cm², and at a rate of from 0.5–0.6 mm/day. The performance of the process with the above-mentioned temperature and pressure ensures high productivity for this process (the rate of crystal growth being sufficiently high) and its increased reproducability. With a higher growth rate, the intensity of the colour of citrine crystals will be greater than that required for the optimal practical use of the crystals. Jewelry articles made of citrine crystals having an intensive colour absorb much light and lose a "play". With the pressure and temperature being below the above-mentioned optimum level, the citrine crystals will be cracked due to the appearance of stresses at the interface between the seeding plate and the monocrystalline layer grown thereon, and whereby decreasing the yield. In addition, the rate of crystal growth is also reduced, and hence the productivity of the process decreases.

The method of producing citrine crystals according to the invention is carried out as follows.

A container with a charge — crystalline quartz — is placed into the bottom part of a high-pressure autoclave which is referred to as a dissolution chamber. The charge may comprise natural mono- or polycrystalline quartz, crystals of synthetic quartz or a mixture of synthetic and natural quartz. Metallic iron in the form of bands or chips is added to the charge before being placed in the autoclave, the iron being uniformly distributed over the volume of the charge. After placing the container into the autoclave a perforated transversal partition of the diaphragm type is mounted above the container at the intermediate portion of the autoclave so as to separate the dissolution chamber from the top portion of the autoclave which is referred to as the growth chamber. Then a frame with crystalline quartz seeding plates attached thereto and oriented in parallel with the pinacoid crystallographic plane {0001} or with planes inclined at an angle within the range of up to 20° with respect to said pinacoid plane is mounted in the growth chamber. The seeding plates having a different orientation may be attached to one and the same frame. After placing the charge and seeding plates in the autoclave an aqueous solution of potassium carbonate (working solution) is charged therein, and then an additive of an oxidizing compound is introduced (such as nitrite or nitrate of an alkali metal, or potassium permanganate). These additives may also be introduced into the dissolution chamber of the autoclave (into the charge container) prior to the filling of the autoclave with the working solution. The degree of filling of the autoclave with the working solution is selected so as to ensure the achievement of a required crystallization temperature (within the range of from 300°–345° C) under a predetermined pressure in the autoclave.

After charging the autoclave, it is tightly sealed, and then the required growth conditions are established using electric heaters (the growth conditions here mean the crystallization temperature, the pressure in the autoclave and the rate of crystals growth). The pressure in the autoclave is due to the thermal expansion of the working solution. Since the process is conducted under the isochoric conditions, the pressure value is functionally dependent upon the temperature in the autoclave. Predetermined conditions of growth are maintained in the autoclave during the entire crystallization cycle. The cycle duration in days is given by the formula $\tau = d/v$, wherein $d$ (in mm) is of a predetermined thickness for a layer of crystalline citrine grown on a seeding plate; $v$ (in mm/day) is the predetermined rate of growth of the grown layer of crystalline citrine on a seeding plate having a selected orientation. After the growth cycle has been completed, the electric heaters are deenergized, the autoclave is cooled down to room temperature in the natural way, then unsealed, and the frame with grown citrine crystals is then withdrawn therefrom. The crystals are removed from the frame, washed with water at room temperature, dried and sent to the customer.

The invention will be better understood from the following examples illustrating the method of producing citrine crystals.

EXAMPLE 1

Synthetic monocrystalline quartz, along with crystalline quartz seeding plates oriented in parallel having pinacoid crystallographic plane {0001}, an aqueous solution of potassium carbonate having a concentration of 5 wt.%, metallic iron in an amount of 2 g per 1 l of the solution and lithium nitrite $LiNO_2$ in an amount of 1 g per 1 l of the solution, were charged into a high-pressure autoclave. Citrine crystals were grown at a crystallization temperature of 300° C, under a pressure of 300 kg/cm², and at a rate of 0.2 mm/day.

The resulting citrine crystals had a highly pure light yellow colour uniformly distributed over the entire volume of the crystals. A part of the crystals (about 30%) had cracks.

EXAMPLE 2

Natural crystalline quartz, along with crystalline quartz seeding plates oriented in parallel with planes inclined with respect to the pinacoid crystallographic plane {0001} at an angle of 10°, an aqueous solution of potassium carbonate having a concentration of 5 wt.%, metallic iron in an amount of 5 g per 1 l of the solution, and lithium nitrate $LiNO_3$ in an amount of 1 g per 1 l of the solution, were charged into a high-pressure autoclave. Citrine crystals were grown at a crystallization temperature of 315° C, under a pressure of 380 kg/cm², and at a rate of 0.3 mm/day.

The resulting citrine crystals had highly pure golden-yellow colour uniformly distributed throughout the entire volume of the crystals and had single cracks.

EXAMPLE 3

A charge consisting of synthetic monocrystalline quartz, along with crystalline quartz seeding plates oriented in parallel with planes inclined with respect to the pinacoid crystallographic plane {0001} at an angle of 18°, an aqueous solution of potassium carbonate having a concentration of 10 wt.%, metallic iron in an amount of 10 g per 1 l of the solution, and lithium nitrate $LiNO_3$ in an amount of 20 g per 1 l of the solution, were charged into a high-pressure autoclave. Citrine crystals were grown at a crystallization temperature of 335° C, under a pressure of 1400 kg/cm$^2$, and at a rate of 0.5 mm/day.

The resulting citrine crystals had no cracks and were of highly pure bright golden-yellow colour uniformly distributed throughout the entire volume of the crystals.

EXAMPLE 4

A charge consisting of natural monocrystalline quartz, along with crystalline quartz seeding plates oriented in parallel with planes inclined with respect to the pinacoid crystallographic plane {0001} at an angle of 20°, an aqueous solution of potassium carbonate having a concentration of 10 wt.%, metallic iron in an amount of 15 g per 1 l of solution and potassium nitrate $KNO_2$ in an amount of 5 g per 1 l of solution, were charged into a high-pressure autoclave. Citrine crystals were grown at a crystallization temperature of 320° C, under a pressure of 400 kg/cm$^2$, and at a rate of 0.4 mm/day.

The resulting citrine crystals had no cracks and were of yellow colour uniformly distributed throughout the entire volume of the crystals.

EXAMPLE 5

A charge consisting of synthetic monocrystalline quartz, along with crystalline quartz seeding plates oriented in parallel with the pinacoid crystallographic plane {0001}, as well as in parallel with planes inclined with respect to said pinacoid plane at 18°, an aqueous solution of potassium carbonate having a concentration of 5 wt. %, metallic iron in an amount of 10 g per 1 l of solution and lithium nitrite $LiNO_2$ in an amount of 1 g per 1 l of solution, were charged into a high-pressure autoclave. Citrine crystals were grown at a crystallization temperature of 335° C, under a pressure of 1400 kg/cm$^2$, and at a rate of 0.6 mm/day.

High-grade citrine crystals were grown under the above-mentioned conditions, with the crystals having an intense golden-yellow colour.

EXAMPLE 6

A charge consisting of a mixture of synthetic monocrystalline quartz and natural polycrystalline quartz, along with crystalline quartz seeding plates oriented in parallel with the pinacoid crystallographic plane {0001}, as well as in parallel with planes inclined with respect to said pinacoid plane at 18°, an aqueous solution of potassium carbonate having a concentration of 5 wt.%, metallic iron in an amount of 20 g per 1 l of the solution and potassium nitrate $KNO_3$ in an amount of 5 g per 1 l of the solution, were charged into a high-pressure autoclave. Citrine crystals were grown at a crystallization temperature of 320° C, under a pressure of 400 kg/cm$^2$, and at a rate of 0.4 mm/day.

The resulting citrine crystals had single cracks and were of a yellow colour uniformly distributed throughout the entire volume of the crystals.

EXAMPLE 7

A charge consisting of synthetic monocrystalline quartz, along with crystalline quartz seeding plates oriented in parallel with the pinacoid crystallographic plane {0001}, an aqueous solution of potassium carbonate having a concentration of 10 wt.%, metallic iron in an amount of 12 g per 1 l of the solution, and sodium nitrite $NaNO_2$ in an amount of 10 g per 1 l of the solution, were charged into a high-pressure autoclave. Citrine crystals were grown at a crystallization temperature of 345° C, under a pressure of 1500 kg/cm$^2$, and at a rate of 1 mm/day.

The resulting citrine crystals had a rather impure (opalescent) yellow colour which was lighter in the outer layer of the crystals, and were characterized by a tuberculous surface of the pinacoid and by the presence of capillary channels in the outer layer having a thickness of 4 mm.

EXAMPLE 8

A charge consisting of synthetic monocrystalline quartz, along with crystalline quartz seeding plates oriented in parallel with the pinacoid crystallographic plane {0001}, an aqueous solution of potassium carbonate having a concentration of 5 wt.%, metallic iron in an amount of 20 g per 1 l of the solution, and sodium nitrate $NaNO_3$ in an amount of 10 g per 1 l of the solution, were charged into a high-pressure autoclave. Citrine crystals were grown at a crystallization temperature of 320° C, under a pressure of 1500 kg/cm$^2$, and at a rate of 1 mm/day.

The resulting citrine crystals were intensively coloured in reddish-orange colour and were opalescent. The colour was uniformly distributed throughout the entire volume of the crystals. There were no cracks in the crystals.

EXAMPLE 9

A charge consisting of natural polycrystalline quartz, along with crystalline quartz seeding plates oriented in parallel with the pinacoid crystallographic plane {0001}, as well as in parallel with planes inclined at 5° with respect to the said pinacoid plane, an aqueous solution of potassium carbonate having a concentration of 10 wt.%, metallic iron in an amount of 10 g per 1 l of the solution, and potassium permanganate $KMnO_4$ in an amount of 5 g per 1 l of the solution, were charged into a high-pressure autoclave. Citrine crystals were grown at a crystallization temperature of 335° C, under a pressure of 1200 kg/cm$^2$, and at a rate of 0.6 mm/day.

The resulting citrine crystals were of a golden-yellow colour uniformly distributed throughout the entire volume of the crystals and had no cracks.

EXAMPLE 10

A charge consisting of synthetic monocrystalline quartz, along with crystalline quartz seeding plates oriented in parallel with the pinacoid crystallographic plane {0001}, an aqueous solution of potassium carbonate having a concentration of 10 wt.%, metallic iron in an amount of 10 g per 1 l of the solution, and lithium nitrite $LiNO_2$ in an amount of 5 g per 1 l of the solution, were charged in a high-pressure autoclave. Citrine crystals were grown at a crystallization temperature of 345° C, under a pressure of 600 kg/cm², and at a rate of 0.8 mm/day.

The resulting citrine crystals were of a yellowy-orange colour in the inner zones and a light yellow colour in the outer zone having a thickness of 5 mm. Capillary cavities in the outer zone of the citrine crystals were evenly disturbed throughout.

EXAMPLE 11

A charge consisting of natural polycrystalline quartz, along with crystalline quartz seeding plates oriented in parallel with the pinacoid crystallographic plane {0001}, an aqueous solution of potassium carbonate having a concentration of 7 wt.%, metallic iron in an amount of 5 g per 1 l of the solution, and caesium nitrate $CsNO_3$ in an amount of 3 g per 1 l of the solution, were charged in a high-pressure autoclave. Citrine crystals were grown at a crystallization temperature of 330° C, under a pressure of 800 kg/cm², and at a rate of 0.4 mm/day.

The resulting citrine crystals were of a light yellow colour uniformly distributed throughout the entire volume of the crystals. The pinacoid surface was characterized by a tuberculous like form.

EXAMPLE 12

A charge consisting of synthetic monocrystalline quartz, along with crystalline quartz seeding plates oriented in parallel with the pinacoid crystallographic plane {0001}, as well as in parallel with planes inclined at 18° with respect to said pinacoid plane, an aqueous solution of potassium carbonate having a concentration of 7 wt.%, metallic iron in an amount of 10 g per 1 l of the solution, and lithium nitrite $LiNO_2$ into an amount of 5 g per 1 l of the solution were charged in a high-pressure autoclave. Citrine crystals were grown at a crystallization temperature of 335° C, under a pressure of 1500 kg/cm², and at a rate of 0.5 mm/day.

The resulting citrine crystals had no cracks and were of an intensive yellow colour with an orange shade. The crystals were uniformly coloured throughout the entire volume of the monocrystalline layer grown.

What is claimed is:

1. In a method of producing citrine crystals by growing said citrine crystals under hydrothermal conditions using the temperature difference method in a high-pressure autoclave on crystalline quartz seeding plates oriented in parallel with the pinacoid crystallographic plane {0001} or with planes inclined at an angle within the range up to 20° with respect to said pinacoid plane, the improvement comprising charging an autoclave with crystalline quartz from aqueous solutions of potassium carbonate having a concentration of 5–10 wt.%, said solutions containing iron which is introduced into said autoclave in the form of metallic iron in an amount of from 2 to 20 g per l. of the solution, along with a compound selected from the group consisting of nitrites and nitrates of alkali metals and potassium permanganate, said compound being introduced into said autoclave in an amount of from 1 to 20 g per l. of the solution to oxidize said metallic iron to trivalent iron, with said growing of the citrine crystals being conducted at a crystallization temperature of from 300° to 345° C, under a pressure of from 300 to 1500 kg/cm², and at a rate of from 0.2 to 1mm/day.

2. The method according to claim 1, wherein lithium nitrite and lithium nitrate are used as nitrites and nitrates of alkali metals.

3. The method according to claim 1, wherein metallic iron in an amount of 10 g per 1 l of solution, as well as compounds selected from the group consisting of nitrites, nitrates of alkali metals and potassium permanganate in an amount of 5 g per 1 l of the solution are introduced in the autoclave prior to the growing of the citrine crystals, and said citrine crystals are grown at a crystallization temperature of 335° C, under a pressure of 1500 kg/cm², and at a rate of from 0.5–0.6 mm/day.

* * * * *